(12) United States Patent
Killingsworth

(10) Patent No.: US 9,997,423 B2
(45) Date of Patent: *Jun. 12, 2018

(54) SEMICONDUCTOR WAFER AND METHOD OF CONCURRENTLY TESTING CIRCUITS FORMED THEREON

(71) Applicant: FREESCALE SEMICONDUCTOR, INC., Austin, TX (US)

(72) Inventor: Dewey Killingsworth, Shah Alam (MY)

(73) Assignee: NXP USA, INC., Austin, TX (US)

( * ) Notice: Subject to any disclaimer, the term of this patent is extended or adjusted under 35 U.S.C. 154(b) by 789 days.

This patent is subject to a terminal disclaimer.

(21) Appl. No.: 14/289,618

(22) Filed: May 28, 2014

(65) Prior Publication Data

US 2015/0287656 A1    Oct. 8, 2015

Related U.S. Application Data

(63) Continuation-in-part of application No. 14/247,264, filed on Apr. 8, 2014.

(51) Int. Cl.
*G01R 31/20* (2006.01)
*H01L 21/66* (2006.01)
*G01R 31/26* (2014.01)

(52) U.S. Cl.
CPC .............. *H01L 22/32* (2013.01); *G01R 31/26* (2013.01); *G01R 31/2607* (2013.01)

(58) Field of Classification Search
CPC  G01R 31/26; G01R 31/2831; G01R 31/2884; G01R 31/2887; G01R 31/2891; G01R 31/2893; G01R 31/318513

USPC ............. 324/750.16, 757.03, 762.03, 762.06
See application file for complete search history.

(56) References Cited

U.S. PATENT DOCUMENTS

| | | | |
|---|---|---|---|
| 4,768,883 A | 9/1988 | Waldo | |
| 5,648,661 A * | 7/1997 | Rostoker | G01R 31/318505 257/208 |
| 5,694,050 A | 12/1997 | Noguchi | |
| 6,563,330 B1 | 5/2003 | Maruyama | |
| 7,009,412 B2 | 3/2006 | Chong | |
| 7,061,256 B2 * | 6/2006 | Hasegawa | G01R 27/205 324/719 |
| 7,821,283 B2 | 10/2010 | Yamada | |
| 7,847,568 B2 | 12/2010 | Gangosa | |

(Continued)

OTHER PUBLICATIONS

Mann, William R., Taber, Frederick L., Seitzer, Philip W., and Broz, Jerry J., "The Leading Edge of Production Wafer Probe Technology," IEEE International Test Conference, Paper No. 41.1, Charlotte, NC, Oct. 26 to Oct. 28, 2004.

*Primary Examiner* — Giovanni Astacio-Oquendo

(74) *Attorney, Agent, or Firm* — Charles E. Bergere

(57) ABSTRACT

A semiconductor wafer has an array of integrated circuit dies formed on it. Each die is enclosed by a respective seal ring. Each die has a group of bond pads and test pads coupled to the bond pads. A test pad region is formed on the wafer. The test pad region has probe pads and common electrical interconnects that selectively electrically couple each of the probe pads to a bond pad on each of the dies. The common electrical interconnects in the test pad region reduce the possibility of probe damage to the integrated circuits and allow the dies to be tested concurrently before being cut from the wafer.

20 Claims, 8 Drawing Sheets

(56) References Cited

U.S. PATENT DOCUMENTS

| | | | |
|---|---|---|---|
| 7,863,914 B2* | 1/2011 | Seo | G01R 31/31715 324/754.07 |
| 8,471,588 B2 | 6/2013 | Matsuda | |
| 9,146,273 B2* | 9/2015 | Pagani | G01R 31/2884 |
| 2002/0157082 A1* | 10/2002 | Shau | G01R 31/2856 716/50 |
| 2003/0201787 A1* | 10/2003 | Manning | G01R 31/31905 324/754.03 |
| 2009/0017565 A1* | 1/2009 | Hasebe | G01R 31/2889 438/17 |
| 2011/0278568 A1* | 11/2011 | Pagani | H01L 24/05 257/48 |
| 2015/0287655 A1* | 10/2015 | Killingsworth | H01L 21/768 324/762.02 |

* cited by examiner

ND METHOD

SEMICONDUCTOR WAFER AND METHOD OF CONCURRENTLY TESTING CIRCUITS FORMED THEREON

CROSS-REFERENCE TO RELATED APPLICATIONS

The present application is a continuation-in-part of U.S. application Ser. No. 14/247,264 filed on Apr. 8, 2014 and assigned to Freescale Semiconductor, Inc.

BACKGROUND OF THE INVENTION

The present invention relates generally to semiconductor wafers, and, more particularly, to a method of testing in parallel integrated circuits formed on the wafer.

In the design and fabrication of integrated circuits, individual circuits are designed used Electronic Design Automation (EDA) tools. When a design is completed (logic design, layout, simulation, etc.), the design is taped out, which means the design is saved in a form that can be used by a wafer fabrication facility to form an integrated circuit of the design on a semiconductor wafer. FIG. 1A is a simplified plan view of an example of an integrated circuit 10 that has been taped out. The integrated circuit 10 includes a plurality of input and output (I/O) pads 12, which includes power and ground pads, as is known in the art.

After the design is taped out, multiple instances of the circuit 10 are formed on a semiconductor wafer, with the individual instances known as dies. FIG. 1B shows a plurality of the integrated circuits 10 or dies as are typically manufactured with an array of identical dies formed on the wafer. The integrated circuits 10 include I/O or bond pads 12 and probe pads 14 that are used for testing the integrated circuits 10.

Once fabricated, the dies are preliminary tested to identify potentially fault free dies from defective dies. For convenience, such preliminary tests are performed before separating the dies from each other by dicing. As shown in FIG. 1C, these preliminary tests are performed using a test card 16 that has probes (pins) 18, with the probes 18 being placed in contact with the probe pads 14 on the integrated circuits 10.

Probe testing is inherently slow because it is a physical process in which the probes 18 are serially moved from test pads 14 on each die 10 to perform a sequence of tests. Testing times have been reduced by testing multiple dies on the wafer in parallel by using test cards with sets of probes. FIG. 1C shows 3 dies being tested at the same time. However, parallel testing of dies is becoming more complex as the number of die bond pads increases and probe pads get smaller. The industry has been addressing these issues by adding more probe pins and tester channels to the testers. However, more complexity and more tester channels equates to higher cost. Also, during probe testing, contact between the test probes and respective test pads results in a force being applied to the active surface of the integrated circuits under test. If this force is excessive, damage may occur to at least some of the integrated circuits being tested.

Therefore, it is an object of the present invention to alleviate at least one of the problems associated with testing dies formed on a wafer prior to dicing.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1A:
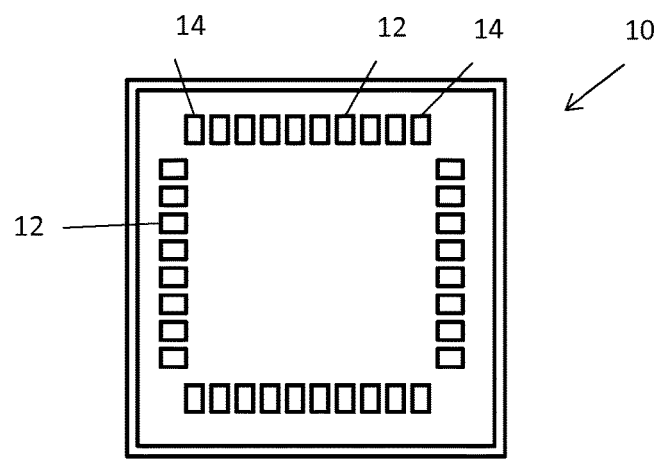
FIG. 1A is a simplified plan view of a conventional integrated circuit.
Figure 1B:
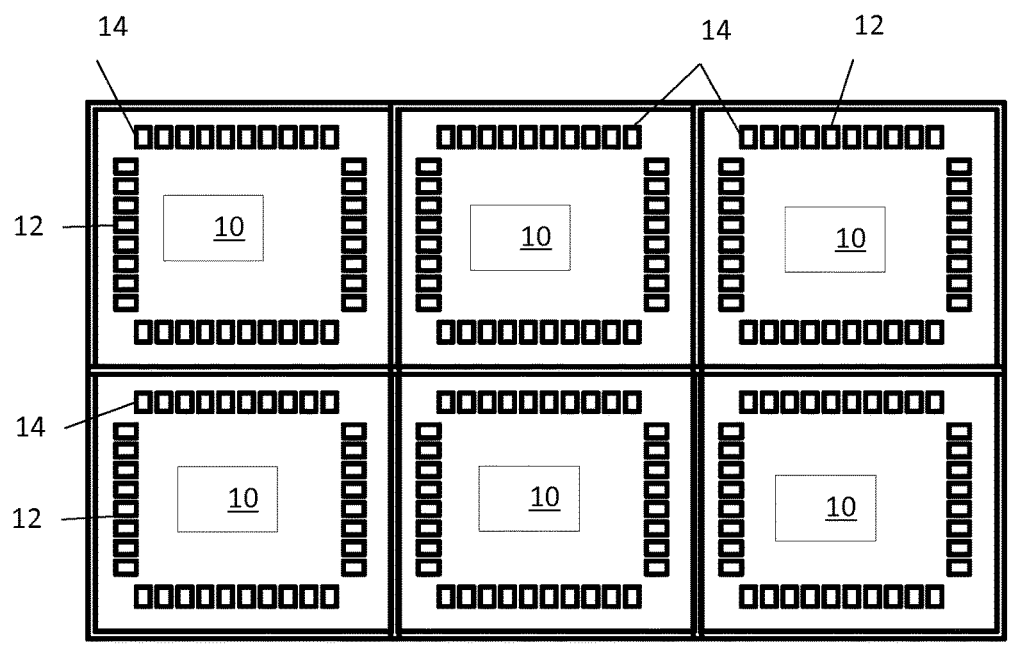
FIG. 1B is a partial plan view of a semiconductor wafer showing how multiple ones of the conventional integrated circuit of FIG. 1A are formed on a semiconductor wafer.
Figure 1C:
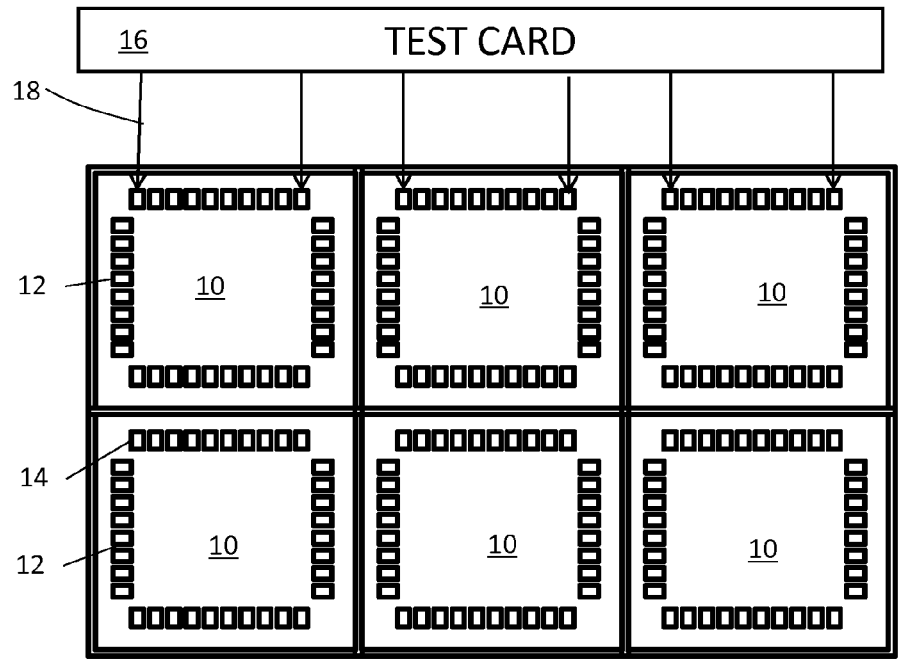
FIG. 1C is a partial plan view of a semiconductor wafer showing how multiple ones of the conventional integrated circuit of FIG. 1A are tested.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a semiconductor wafer that includes a semiconductor substrate and an array comprising identical integrated circuits formed on the substrate. Each of the circuits has a plurality of bond pads and seal rings enclose a respective one of the integrated circuits. There is at least one test pad region formed on the substrate, and the test pad region includes at least a first probe pad and a second probe pad. There is a first common electrical interconnect that electrically couples the first probe pad to a respective one of the bond pads of each of the integrated circuits of the array. There is also a second common electrical interconnect that electrically couples the second probe pad to a respective one of the bond pads of each of the integrated circuits of the array.

In another embodiment, the present invention provides for a method of testing an array of identical integrated circuits formed on a semiconductor substrate. Each of the integrated circuits is enclosed by a respective seal ring and each of the integrated circuits has a plurality of bond pads. There is at least one test pad region formed on the substrate, and the test pad region includes a first probe pad and a second probe pad. The array comprises a first common electrical interconnect that electrically couples the first probe pad to a respective one of the bond pads of each of the integrated circuits. The array further comprises a second common electrical interconnect that electrically couples the second probe pad to a respective one of the bond pads of each of the integrated circuits. The method includes selectively coupling test probes to the first and second probe pads, and then selectively supplying input test patterns to the test probes to thereby concurrently supply the input test patterns to all the integrated circuits in the array. The method then processes output test patterns from the test probes in response to the input test patterns. The output test patterns are received by one or more of said test probes to thereby determine if any of the integrated circuits are faulty.

In a further embodiment, the present invention provides for a method of assembling a packaged integrated, the method includes receiving a semiconductor wafer substrate with an array of identical fabricated semiconductor circuits formed on the semiconductor wafer substrate. Each of the circuits has a plurality of bond pads and seal rings enclose a respective one of the integrated circuits. There is at least one test pad region formed on the substrate, and the test pad region includes at least a first probe pad and a second probe pad. There is a first common electrical interconnect that electrically couples the first probe pad to a respective one of the bond pads of each of the integrated circuits of the array. There is also a second common electrical interconnect that electrically couples the second probe pad to a respective one of the bond pads of each of the integrated circuits of the array. Each of the integrated circuits has at least one individual circuit test pad coupled to one of the bond pads, and wherein the individual circuit test pad is electrically isolated from all other integrated circuits. The method provides for testing concurrently each of the integrated circuits with input test patterns applied to the probe pads and circuit test pads to identify which integrated circuits are fault free. Then there is performed a process of cutting one of the fault free integrated circuits from the semiconductor wafer substrate to provide a single integrated circuit enclosed by a said seal ring. Next, a process of selectively electrically connecting the bond pads to external package connectors is performed followed by enclosing the integrated circuit in a protective housing.

In yet another embodiment, the present invention provides a tape-out design that includes a plurality of identical integrated circuit designs and at least one least one test pad region, each of the integrated circuit designs has a plurality of input and output pads and the test pad region has a plurality of probe pads coupled to respective bond pads of each of the integrated circuits. Also, each of the integrated circuit designs is surrounded by a seal ring. Thus, instead of taping out a single integrated circuit design, according to the present invention, a plurality of integrated circuit designs having selected bond pads coupled to respective probe pads of the test pad region is provided. Consequently the invention allows for concurrent testing of the dies fabricated on a wafer.

Figure 2:
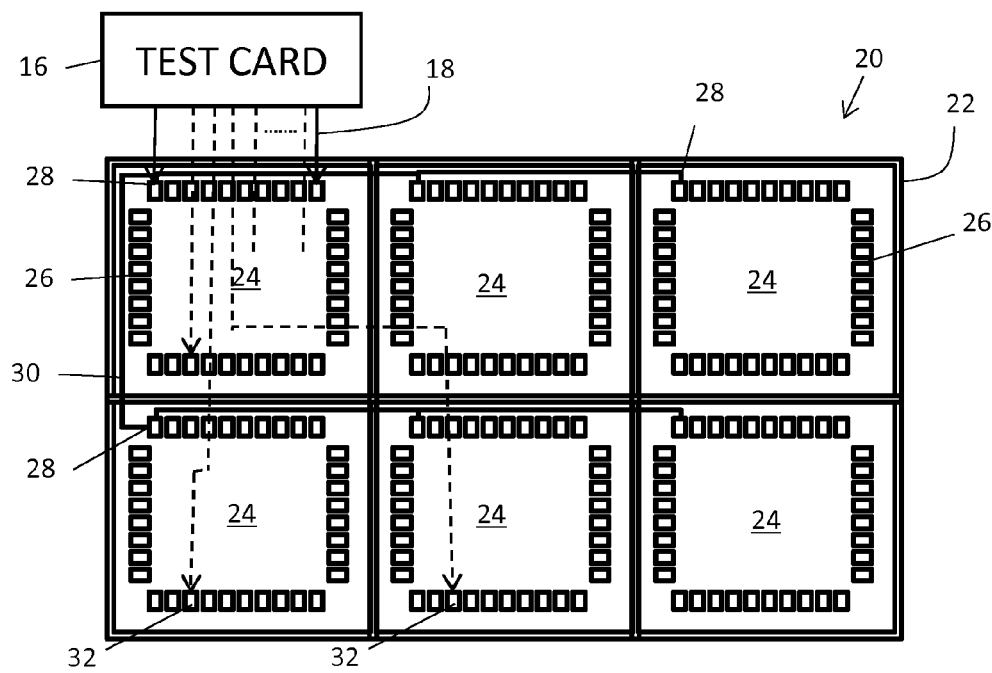
FIG. 2 is a partial plan view of a semiconductor wafer illustrating how multiple integrated circuits in accordance with the present invention are concurrently tested.

Referring now to FIG. 2, a partial plan view of a semiconductor wafer 20 in accordance with an embodiment of the present invention is shown. The wafer 20 has one or more arrays 22 of identical integrated circuit dies 24 formed thereon. FIG. 2 shows just one 2×3 array. Each of the dies 24 is separated by a sealing ring, as is known in the art. Each die 24 includes bond pads 26 and probe pads 28, also as are known in the art. However, according to the present invention, respective ones of the probe pads 28 of adjacent dies are connected, one to another, with an interconnect 30 that traverses the dies 24 and sealing rings, as will be discussed in more detail below. The present invention allows the dies 24 to be concurrently tested using the test card 16 and probes 18. However, as can be seen, multiple dies can be tested using fewer probes than necessary in the conventional die testing. Furthermore, the test card may have additional probes contacting selected individual test pads 32 on each of the dies 24.

Figure 3:
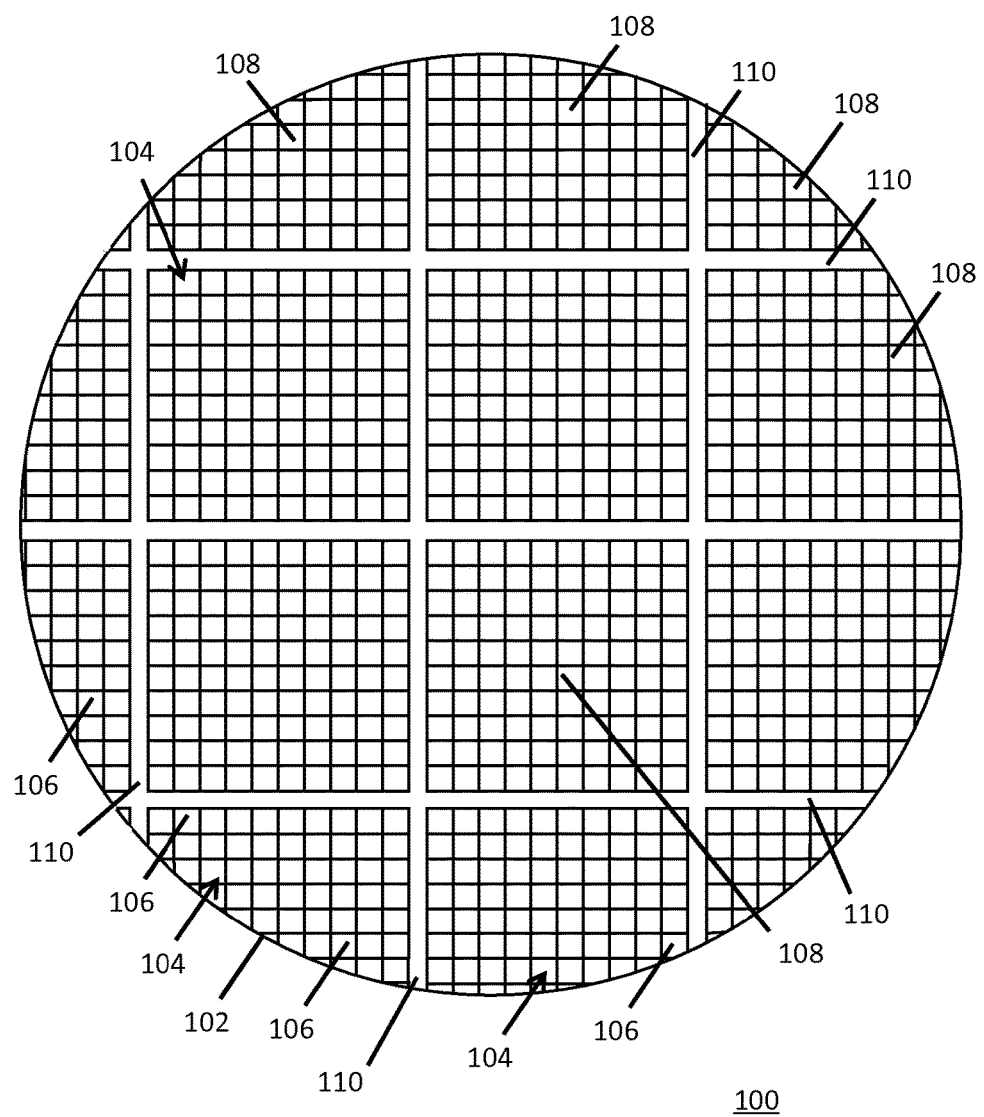
FIG. 3 is a plan view of a semiconductor wafer according to a general embodiment of the present invention.

Referring to FIG. 3 there is shown a plan view of a semiconductor wafer 100, according to a general embodiment of the present invention. The semiconductor wafer 100 includes a semiconductor substrate 102 with a plurality of array areas, each of the array areas being an array 104 comprising identical integrated circuits 106 formed on the semiconductor substrate 102. There is also an array test pad region 108 located in each array, and each array test pad region 108 is formed on the semiconductor substrate 102. In this embodiment each array 104 is spaced from all other arrays 104 by array boundary regions 110, however in other embodiments there may not necessarily be a need for such spacing. Also, as can be seen, some of the arrays 104 are uniform in size (e.g., 10×10), while others, especially those adjacent to an edge of the substrate, may be non-uniform (e.g., 10×n, where n varies from 1 to 10, for example).

Figure 4:
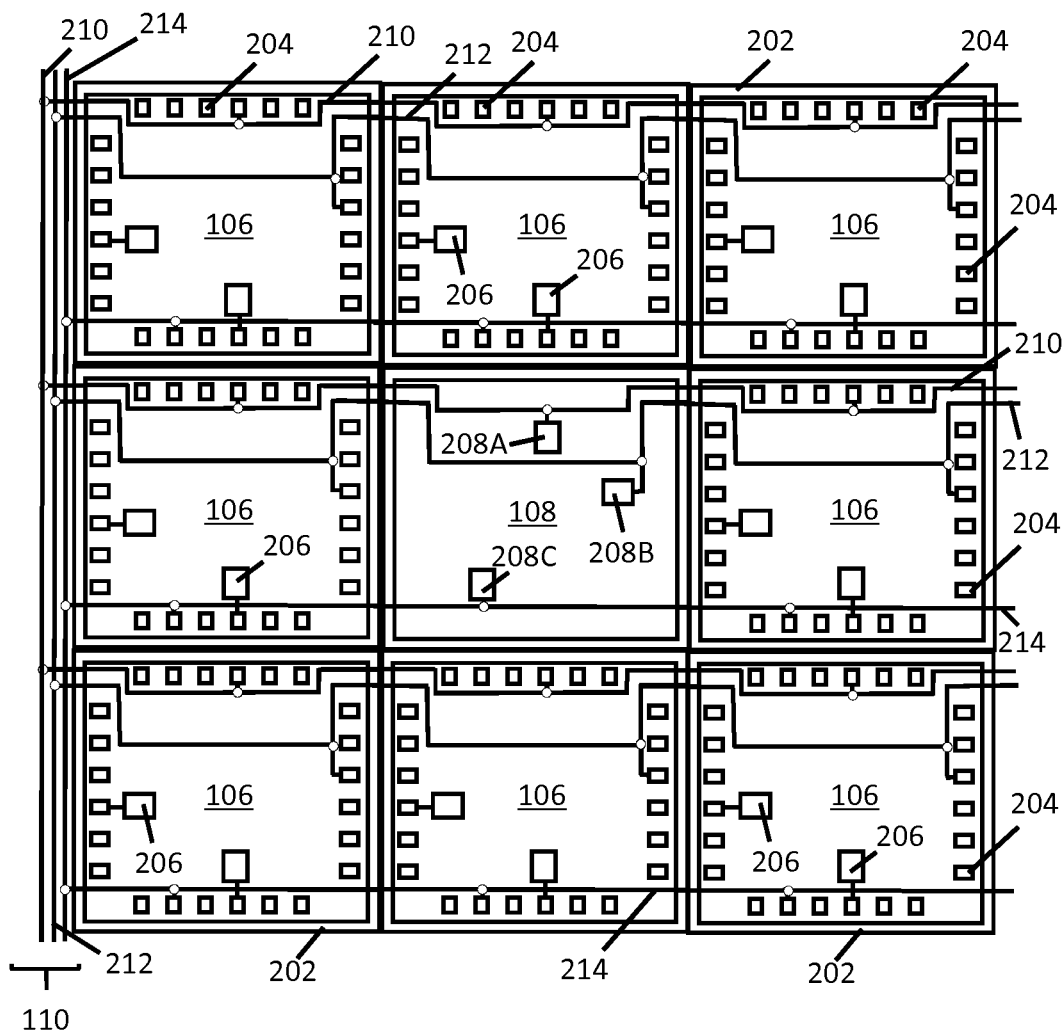
FIG. 4 is a detailed plan view of part of one array of integrated circuits formed on the wafer of FIG. 3, according to a first embodiment of the present invention.

FIG. 4 shows a detailed plan view of part of one array 200 which is one of the arrays 104 comprising the integrated circuits 106 formed on the wafer 100, according to a first embodiment of the present invention. As shown, each of the integrated circuits 106 is enclosed by a respective seal ring 202. The integrated circuits 106 each have a group of bond pads 204 with circuit test pads 206 selectively coupled to a respective one of the bond pads 204, in which the circuit test pads 206 are electrically isolated from all other integrated circuits 106.

The array 200 also includes an above-mentioned test pad region 108 which comprises probe pads. In this particular embodiment there are three probe pads 208A to 208C namely a first probe pad 208A, a second probe pad 208B and a third probe pad 208C.

As will be apparent to a person skilled in the art, the circuit test pads 206 and bond pads 204 are located on an active surface of each of the integrated circuits 106. Also, the circuit test pads 206 and probe pads 208A to 208C are located on the same surface of the wafer 100.

There is a first common electrical interconnect 210 that electrically couples the first probe pad 208A to a respective one of the bond pads 204 of each of the integrated circuits 106. In this embodiment there are two other common electrical interconnects namely, second common interconnect 212 and third common interconnect 214. Also, the second common interconnect 212 couples the second probe pad 208B to a respective one of the bond pads 204 of each of the integrated circuits 106. Similarly, the third common interconnect 214 couples the third probe pad 208C to a respective one of the bond pads 204 of each of the integrated circuits 106. As will be apparent to a person skilled in the art the interconnects 210, 212, 214 are on the active side of the integrated circuits 106.

In this embodiment there are two circuit test pads 206 per integrated circuit 106. However, there may be many more such circuit test pads 206 depending on the complexity of the semiconductor circuits 106 and required probe test patterns as described below. Furthermore, in this embodiment, to provide interconnection between the probe pads 208A to 208C and their respective bond pads 204 in the array 200, vertical lengths of the common interconnections 208, 210, 212 run along a side of the array 200 in one of the boundary regions 110.

Figure 5:
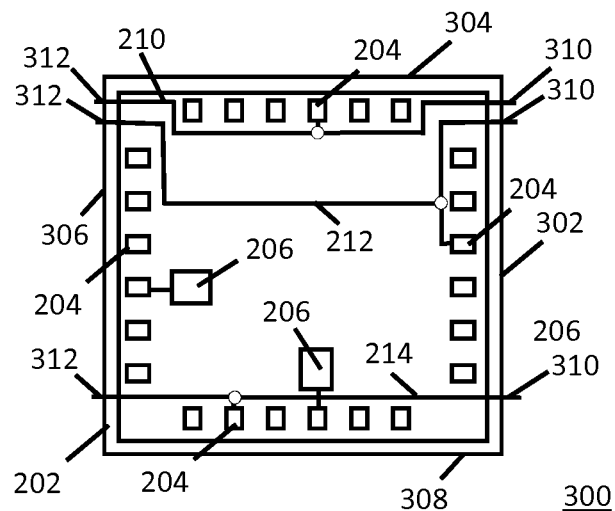
FIG. 5 is a detailed plan view of a single integrated circuit of the array of FIG. 4, according to the first embodiment of the present invention.

FIG. 5 is a detailed plan view of a single integrated circuit 300, which is one of the integrated circuits 106 of the array 200, according to the first embodiment of the present invention. As shown, the seal ring 202 is rectangular and therefore provides a rectangular boundary of four boundary edges 302, 304, 306, 308 and each common electrical interconnect 210, 212, 214 includes two interface runner regions 310, 312 extending past a respective boundary edge. More specifically, in this embodiment interface runner regions 310 cross and extend past the boundary edge 302 and interface runner regions 312 cross and extend past the boundary edge 306. It will also be apparent to a person skilled in the art that each interface runner region 310 is positioned to be aligned with and coupled to an interface runner region 312 on an adjacent one of integrated circuits 106 in the array 200 and vice versa.

Figure 6:
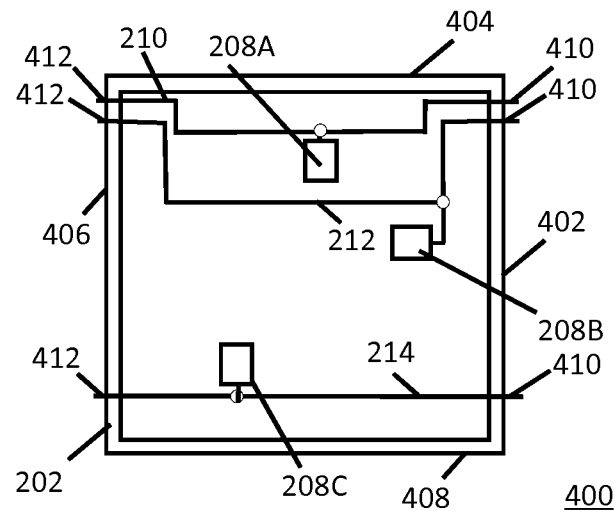
FIG. 6 is a detailed plan view of a test pad region of the array of FIG. 4, according to the first embodiment of the present invention.

FIG. 6 shows a detailed plan view of a test pad region 400 according to the first embodiment of the test pad region 108 forming part of the array 200. As shown, the seal ring 202 is rectangular and therefore provides a rectangular boundary of four boundary edges 402, 404, 406, 408 and each common electrical interconnect 210, 212, 214 includes two interface runner regions 410, 412 extending past a respective boundary edge. More specifically, in this embodiment interface runner regions 410 cross and extend past the boundary edge 402 and interface runner regions 412 cross and extend past the boundary edge 406. It will also be apparent to a person skilled in the art that each interface runner region 410 is positioned to be aligned with and coupled to an interface runner region 312 on an adjacent integrated circuit 106 in the array 200. Similarly, each interface runner region 412 is positioned to be aligned with and coupled to an interface runner region 310 on an adjacent integrated circuit 106 in the array 200.

Figure 7:
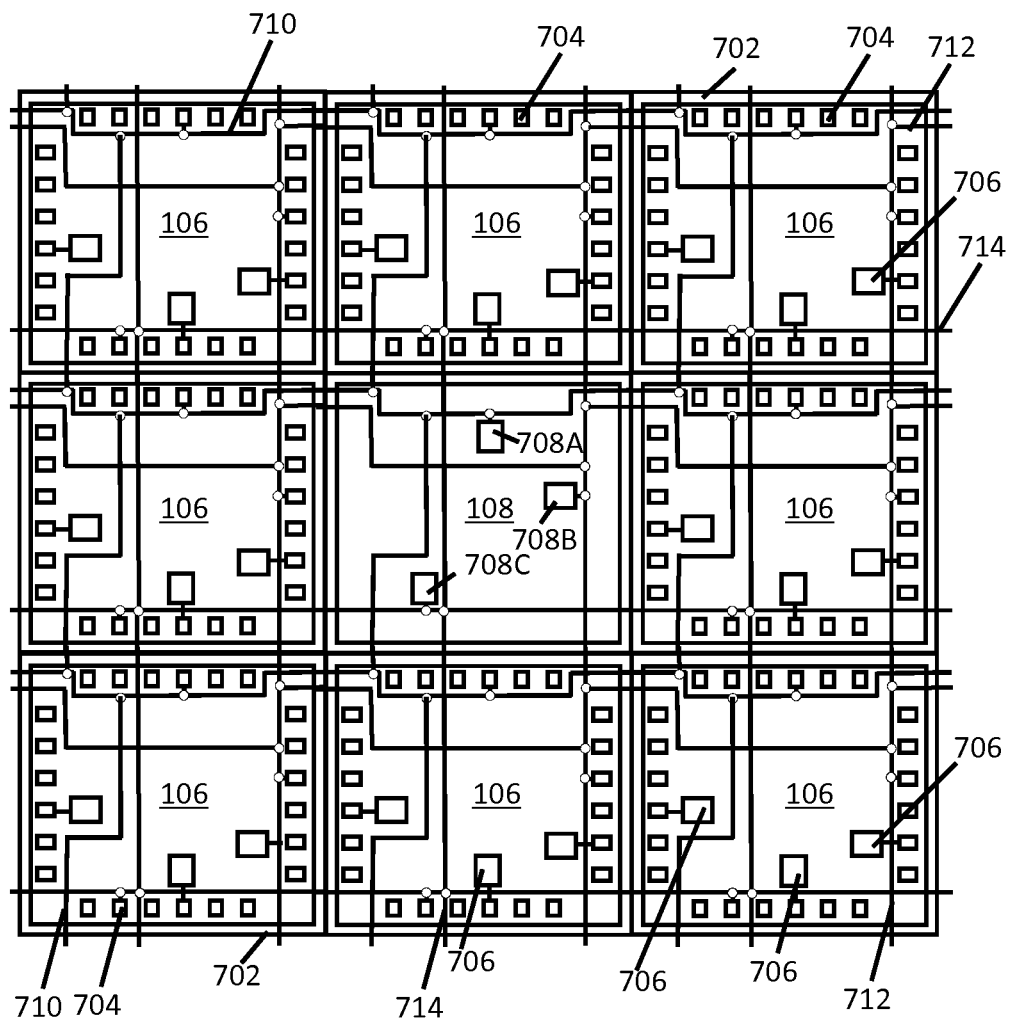
FIG. 7 is a detailed plan view of part of one array of integrated circuits formed on the wafer of FIG. 3, according to a second embodiment of the present invention.

FIG. 7 is a detailed plan view of part of one array 700 which is one of the arrays 104 comprising the integrated circuits 106 formed on the wafer 100, according to a second embodiment of the present invention. Each of the integrated circuits 106 is enclosed by a respective seal ring 702. The integrated circuits 106 each have a group of bond pads 704 with circuit test pads 706 selectively coupled to a respective one of the bond pads 704, in which the circuit test pads 706 are electrically isolated from all other integrated circuits 106.

The array 700 also includes an above-mentioned test pad region 108 which comprises probe pads. In this particular embodiment there are three probe pads 708A to 708C namely a first probe pad 708A, a second probe pad 708B and a third probe pad 708C.

As will be apparent to a person skilled in the art, the circuit test pads 706 and bond pads 704 are located on an active surface of each of the integrated circuits 106. Also, the circuit test pads 706 and probe pads 708A to 708C are located on the same surface of the wafer 100.

There is a first common electrical interconnect 710 that electrically couples the first probe pad 708A to a respective one of the bond pads 704 of each of the integrated circuits 106. In this embodiment there are two other common electrical interconnects namely, second common interconnect 712 and third common interconnect 714. Also, the second common interconnect 712 couples the second probe pad 708B to a respective one of the bond pads 704 of each of the integrated circuits 106. Similarly, the third common interconnect 714 couples the third probe pad 708C to a respective one of the bond pads 704 of each of the integrated circuits 106. As will be apparent to a person skilled in the art, every one of the interconnects 710, 712 and 714 are on the active side of the integrated circuits 106.

In this embodiment there are three circuit test pads 706 per integrated circuit 106. However, there may be many more or there can be less such circuit test pads 706 depending on the complexity of the semiconductor circuits 106 and required probe test patterns as described below.

Figure 8:
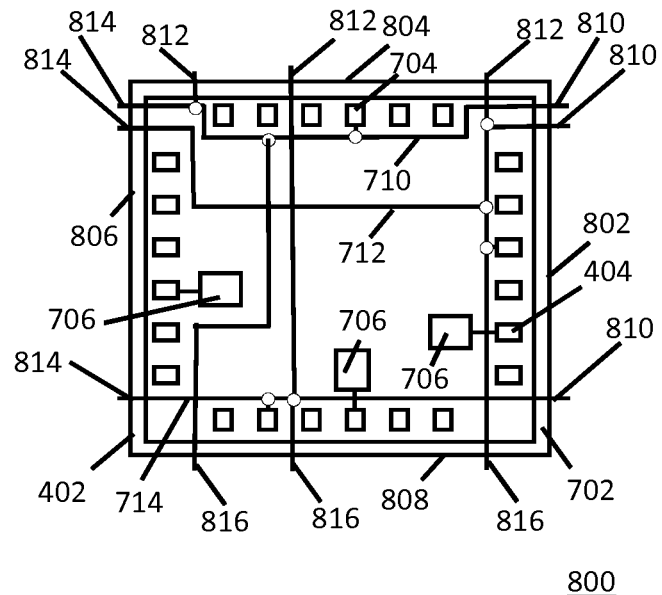
FIG. 8 is a plan view of a single integrated circuit of the array of FIG. 6 according to the second embodiment of the present invention.

Referring to FIG. 8, a detailed plan view of a single integrated circuit 800, which is one of the integrated circuits 106 of the array, according to the second embodiment of the present invention, is shown. As shown, the seal ring 702 is rectangular and therefore provides a rectangular boundary of four boundary edges 802, 804, 806, 808 and each common electrical interconnect 710, 712, 714 includes four interface runner regions 810, 812, 814, 816 extending past a respective boundary edge. More specifically, in this embodiment interface runner regions 810 cross and extend past the boundary edge 802, interface runner regions 812 cross and extend past the boundary edge 804, interface runner regions 814 cross and extend past the boundary edge 806, and interface runner regions 816 cross and extend past the boundary edge 808. It will also be apparent to a person skilled in the art that each interface runner region 810 is positioned to be aligned with and coupled to an interface runner region 814 on an adjacent one of integrated circuits 106 in the array 400. Similarly, each interface runner region 812 is positioned to be aligned with and coupled to an interface runner region 816 on an adjacent one of integrated circuits 106 in the array 700.

Figure 9:
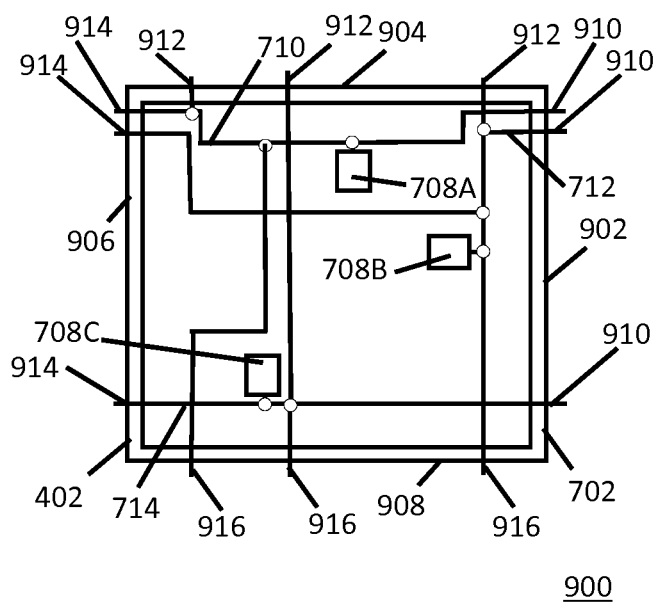
FIG. 9 is a detailed plan view of a test pad region of the array of FIG. 7 according to the second embodiment of the present invention.

Referring to FIG. 9, there is shown a detailed plan view of the test pad region 900 according to the second embodiment of the test pad region 108 forming part of the array 700. As shown, the seal ring 702 is rectangular and therefore provides a rectangular boundary of four boundary edges 902, 904, 906, 908 and each common electrical interconnect 710, 712, 714 includes four interface runner regions 910, 912, 914, 916 extending past a respective boundary edge. More specifically, in this embodiment interface runner regions 910 cross and extend past the boundary edge 902, interface runner regions 912 cross and extend past the boundary edge 904, interface runner regions 914 cross and extend past the boundary edge 906, and interface runner regions 916 cross and extend past the boundary edge 908. It will also be apparent to a person skilled in the art that each interface runner region 910 is positioned to be aligned with and coupled to an interface runner region 814 on an adjacent one of integrated circuits 106 in the array 700. Similarly, each interface runner region 912 is positioned to be aligned with and coupled to an interface runner region 816 on an adjacent one of integrated circuits 106 in the array 700.

Figure 10:
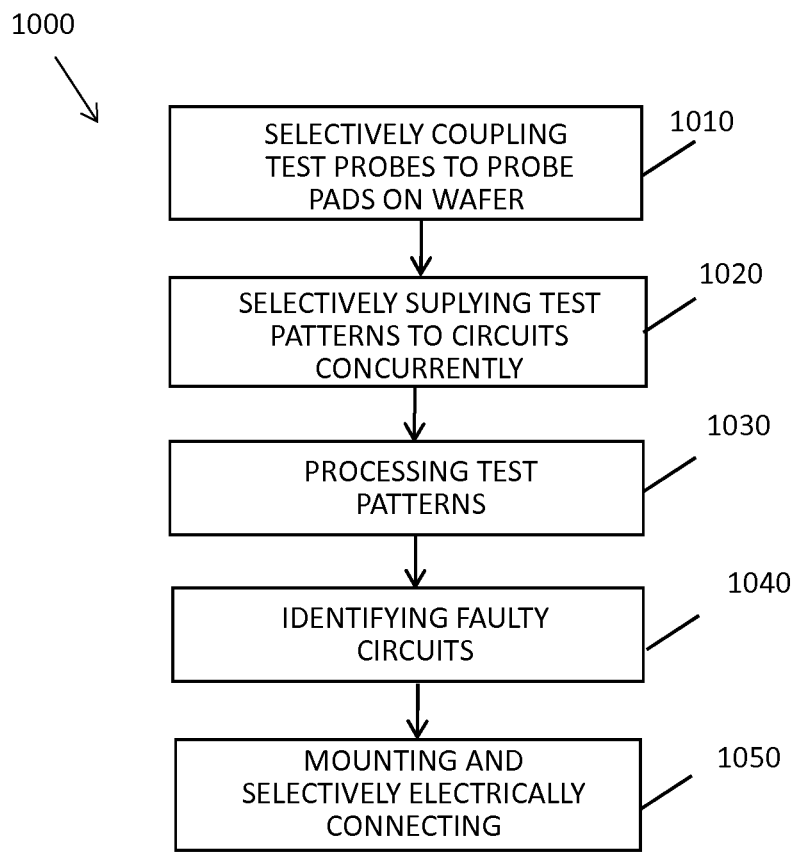
FIG. 10 is a flow chart of a method of testing the array of identical fabricated semiconductor circuits, and thereafter fabricating a packaged integrated, according to a third embodiment of the present invention.

Referring to FIG. 10, a flow chart of a method 1000 of testing each array of identically fabricated semiconductor circuits 106, and thereafter assembling a packaged semiconductor die, according to a third embodiment of the present invention, is shown. The method 1000 will be described, by way of illustration only, with reference to the array 200 and semiconductor die circuit 300. The method 1000 at a block 1010 performs a process of selectively coupling test probes of an automatic test station to the probe pads 208A to 208C. In this regard only one test probe is required to be coupled to each of the common interconnections 210, 212, 214 via a single one of the probe pads 208A to 208C. Thus, since in this example there are only three common interconnections 210, 212, 214 then only three test probes are required for coupling to the probe pads 208A to 208C. It will be apparent to a person skilled in the art that in one embodiment the selectively coupling includes concurrently coupling of some of the test probes to a respective die test pad 206 of each of the integrated circuits 300 in the array 200.

At block 1020, a process of selectively supplying input test patterns to the test probes is performed, thereby concurrently supplying the input test patterns to all the semiconductor circuits 106 in the array 200. The test patents may include instructions to configure each of the integrated circuits 300 to perform scan path testing, built in self-testing or any other form of sequential or combinational logic test strategies as will be apparent to a person skilled in the art.

Output test patterns from the test probes are processed at a block 1030. These test output patterns are received by one or more of test probes to thereby identify which, if any, of the integrated circuits 300 are faulty. More specifically, the selectively coupling, at block 1010, includes coupling of some of the test probes to the die test pads 206 and the selectively supplying of the input test patterns to the probe pads 208A to 208C and die test pads 206 is performed concurrently. Furthermore, at least one of the die test pads 206 of each of the integrated circuits 500 is used to supply the output test patterns to the test probes. This therefore allows for each of the integrated circuits 300 to be tested concurrently.

After completion of block 1040, each of the of the integrated circuits 300 has been tested with input test patterns applied to the probe pads 208A to 208C and pads test pads 206 to identify which integrated circuits are fault free. Then a dicing process is performed in which the dies are cut from the wafer and the fault free semiconductor circuits 300 from the semiconductor substrate 102 are separated from the faulty circuits to provide a single semiconductor die circuit enclosed by the seal ring 202. The seal ring provides 202 a rectangular boundary of the four boundary edges 302, 304, 306, 308 and the interface runner regions 310, 312, 314, 316 extend to a respective boundary edge 302, 304, 306, 308.

Each fault free semiconductor circuit 300 is then further processed, at a block 1050, by mounting and selectively electrically connecting the bond pads 204 to a mount with associated external package connectors. The mount and connectors are typically a lead frame including a die flag or paddle and leads, or a redistribution layer substrate with mounting pads as will be apparent to a person skilled in the art. Thereafter, sub-assemblies of lead frames or substrates and dies electrically connected to the lead frames or substrates, is enclosed in a protective housing that can be a mold compound or a hollow cover.

Advantageously, the present invention provides for concurrent parallel probe testing of an array of integrated circuits that provides for reducing the required numbers of test probes. Furthermore, since most of the test probes engage pads on the test pad region 108, the problems associated with test probe damage to the integrated circuits 106 is at least alleviated.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor wafer, comprising:
    a semiconductor substrate;
    an array comprising identical integrated circuits formed on the substrate, wherein each of the integrated circuits has a plurality of bond pads;
    a plurality of seal rings, each seal ring enclosing a respective one of the integrated circuits;
    at least one test pad region formed on the substrate, wherein the at least one test pad region includes at least a first probe pad and a second probe pad;
    a first common electrical interconnect that electrically couples the first probe pad to a respective one of the bond pads of each of the integrated circuits of the array; and
    a second common electrical interconnect that electrically couples the second probe pad to a respective one of the bond pads of each of the integrated circuits of the array.

2. The semiconductor wafer as claimed in claim 1, wherein the each of the seal rings provide a rectangular boundary of four boundary edges and the first and second common electrical interconnects each include an interface runner region extending past each respective boundary edge.

3. The semiconductor wafer as claimed in claim 2, wherein each interface runner region is aligned with and coupled to an interface runner region on an adjacent one of the identical circuits.

4. The semiconductor wafer as claimed in claim 1, wherein the first common electrical interconnect and the second common electrical interconnect are on an active surface of each of the integrated circuits.

5. The semiconductor wafer as claimed in claim 1, wherein a further one of the seal rings encloses the at least one test pad region.

6. The semiconductor wafer as claimed in claim 1, wherein the at least one test pad region forms part of the array.

7. The semiconductor wafer as claimed in claim 1, wherein each of the integrated circuits has at least one individual circuit test pad coupled to one of the bond pads, and wherein the individual circuit test pad is electrically isolated from all other integrated circuits.

8. A method of testing an array of identical integrated circuits formed on a semiconductor substrate, each of the integrated circuits being enclosed by a respective seal ring and each of the integrated circuits having a plurality of bond pads, wherein there is at least one test pad region formed on the substrate, and the at least one test pad region includes at least a first probe pad and a second probe pad, and wherein the array comprises a first common electrical interconnect that electrically couples the first probe pad to a respective one of the bond pads of each of the integrated circuits of the array, and the array further comprises a second common electrical interconnect that electrically couples the second probe pad to a respective one of the bond pads of each of the integrated circuits of the array, the method comprising:

selectively coupling test probes to the first and second probe pads;

selectively supplying input test patterns to the test probes to thereby concurrently supply the input test patterns to all the integrated circuits in the array; and processing output test patterns from the test probes in response to the input test patterns, wherein the output test patterns are received by one or more of said test probes to thereby determine if any of the integrated circuits are faulty.

9. The method of testing as claimed in claim 8, wherein each of the integrated circuits has at least one individual circuit test pad coupled to one of the bond pads, and wherein the at least one individual circuit test pad is electrically isolated from all other integrated circuits.

10. The method of testing as claimed in claim 9, wherein the selectively coupling includes coupling at least one of the test probes to the at least one individual circuit test pad, and selectively supplying of the input test patterns to the probe pads and the at least one individual circuit test pad is performed concurrently.

11. The method of testing as claimed in claim 10, wherein the processing identifies which, if any, of the integrated circuits are faulty.

12. The method of testing as claimed in claim 8, wherein the each of the seal rings provide a rectangular boundary of four boundary edges and the first and second common electrical interconnects each include an interface runner region extending past each respective boundary edge.

13. The method of testing as claimed in claim 12, wherein each interface runner region is aligned with and coupled to an interface runner region on an adjacent one of the identical integrated circuits.

14. The method of testing as claimed in claim 8, wherein the probe pads include pads for supplying the input test input test patterns and at least one of the circuit test pads includes a pad for providing part of the output test patterns.

15. A method of assembling a packaged integrated circuit, the method including:

receiving a semiconductor wafer substrate with an array of identical fabricated semiconductor integrated circuits formed on the semiconductor wafer substrate, each of the integrated circuits being enclosed by a respective seal ring and each of the integrated circuits having a plurality of bond pads, wherein there is at least one test pad region formed on the substrate, and the at least one test pad region includes at least a first probe pad and a second probe pad, and wherein the array comprises a first common electrical interconnect that electrically couples the first probe pad to a respective one of the bond pads of each of the integrated circuits of the array, and the array further comprises a second common electrical interconnect that electrically couples the second probe pad to a respective one of the bond pads of each of the integrated circuits of the array, and wherein each of the integrated circuits has at least one individual circuit test pad coupled to one of the bond pads, and wherein the at least one individual circuit test pad is electrically isolated from all other integrated circuits;

testing concurrently each of the integrated circuits with input test patterns applied to the at least first and second probe pads and the at least one individual circuit test pads to identify which integrated circuits are fault free;

cutting one of the fault free integrated circuits from the semiconductor wafer substrate to provide a single integrated circuit enclosed by a said seal ring;

selectively electrically connecting the bond pads to external package connectors; and enclosing the cut integrated circuit in a protective housing.

16. The method of claim 15, wherein the first common electrical interconnect and the second common electrical interconnect are on an active surface of each of the integrated circuits.

17. The method of claim 15, wherein the each of the seal rings provide a rectangular boundary of four boundary edges and the first and second common electrical interconnects each include an interface runner region extending past each respective boundary edge.

18. The method of claim 15, wherein each integrated circuit includes more than one circuit test pad.

19. The method of claim 15, wherein the probe pads include pads for supplying the input test patterns and at least one of the circuit test pads includes a pad for providing part of the output test patterns.

20. The method of claim 17, wherein each interface runner region is aligned with and coupled to an interface runner region on an adjacent one of the integrated circuits.

* * * * *